United States Patent
Liu et al.

(10) Patent No.: US 8,584,057 B2
(45) Date of Patent: *Nov. 12, 2013

(54) NON-DIRECTIONAL DITHERING METHODS

(75) Inventors: Pei-Yi Liu, Changhua (TW); Shy-Jay Lin, Jhudong Township, Hsinchu County (TW); Wen-Chuan Wang, Hsinchu (TW); Jaw-Jung Shin, Hsinchu (TW); Burn Jeng Lin, Hsinchu (TW)

(73) Assignee: Taiwan Semiconductor Manufacturing Copmany, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/409,653

(22) Filed: Mar. 1, 2012

(65) Prior Publication Data

US 2013/0232453 A1   Sep. 5, 2013

(51) Int. Cl.
| G06F 17/50 | (2006.01) |
| G06F 19/00 | (2011.01) |
| G03F 1/00 | (2012.01) |
| G21K 5/00 | (2006.01) |

(52) U.S. Cl.
CPC ............ *G06F 17/5081* (2013.01); *G06F 19/00* (2013.01); *G21K 5/00* (2013.01); *G03F 1/00* (2013.01)
USPC .................. 716/53; 716/54; 716/55; 700/98; 700/118; 700/120; 700/121; 430/5; 378/35; 250/492.2; 250/492.22

(58) Field of Classification Search
CPC ....... G06F 17/5081; G06F 19/00; G21K 5/00; G03F 1/00
USPC .......... 716/53, 54, 55; 700/98, 118, 120, 121; 430/5; 378/35; 250/492.2, 492.22
See application file for complete search history.

(56) References Cited

U.S. PATENT DOCUMENTS

| 5,305,057 | A * | 4/1994 | Hattori et al. ................. 358/519 |
| 6,272,207 | B1 * | 8/2001 | Tang ............................. 378/149 |
| 6,333,129 | B2 * | 12/2001 | Kim et al. .......................... 430/5 |
| 6,866,969 | B2 * | 3/2005 | Miyamae et al. .................. 430/5 |
| 7,771,897 | B2 * | 8/2010 | Furukawa .......................... 430/5 |
| 8,222,621 | B2 * | 7/2012 | Fragner et al. ........... 250/492.22 |

(Continued)

FOREIGN PATENT DOCUMENTS

JP    10270348 A  * 10/1998

OTHER PUBLICATIONS

Unpublished U.S. Appl. No. 13/368,877 entitled "A Multiple-Grid Exposure Method", filed Feb. 8, 2012, 31 pages.

(Continued)

*Primary Examiner* — Phallaka Kik
(74) *Attorney, Agent, or Firm* — Haynes and Boone, LLP

(57) ABSTRACT

A method of data preparation in lithography processes is described. The method includes providing an integrated circuit (IC) layout design in a graphic database system (GDS) grid, converting the IC layout design GDS grid to a first exposure grid, applying a non-directional dither technique to the first exposure, coincident with applying dithering to the first expose grid, applying a grid shift to the first exposure grid to generate a grid-shifted exposure grid and applying a dither to the grid-shifted exposure grid, and adding the first exposure grid (after receiving dithering) to the grid-shifted exposure grid (after receiving dithering) to generate a second exposure grid.

20 Claims, 5 Drawing Sheets

(56) References Cited

U.S. PATENT DOCUMENTS

| | | | |
|---|---|---|---|
| 8,335,999 B2* | 12/2012 | Katzir et al. | 716/50 |
| 2001/0038952 A1* | 11/2001 | Kim et al. | 430/5 |
| 2003/0096176 A1* | 5/2003 | Miyamae et al. | 430/5 |
| 2003/0138742 A1* | 7/2003 | Irie et al. | 430/396 |
| 2007/0224521 A1* | 9/2007 | Furukawa | 430/5 |
| 2008/0239266 A1* | 10/2008 | Noboru | 355/53 |
| 2010/0127185 A1* | 5/2010 | Fragner et al. | 250/398 |
| 2012/0262686 A1* | 10/2012 | Laidig | 355/53 |
| 2012/0286169 A1* | 11/2012 | Van De Peut et al. | 250/396 R |
| 2013/0003029 A1* | 1/2013 | Laidig | 355/53 |

OTHER PUBLICATIONS

Unpublished U.S. Appl. No. 13/409,765 entitled "An Algorithm of Error-Diffusion and Grid Shift", filed Mar. 1, 2012, 19 pages.

* cited by examiner

NON-DIRECTIONAL DITHERING METHODS

BACKGROUND

The semiconductor industry has experienced exponential growth. Continuous advancements in lithographic resolution have been made to support critical dimensions (CDs) of 90 nm to 65 nm, 45 nm, 32 nm, 22 nm, 16 nm and beyond. New techniques in lithography have been developed, such as immersion lithography, multiple patterning, extreme ultraviolet (EUV) lithography and e-beam lithography. The challenges being raised by new lithography techniques are not only in resolution but also in economy (e.g. cost of upgrading and loss of throughput). Many developments have focused on improving resolution with reduced loss of process throughput. However, current methods have not been satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Figure 1:
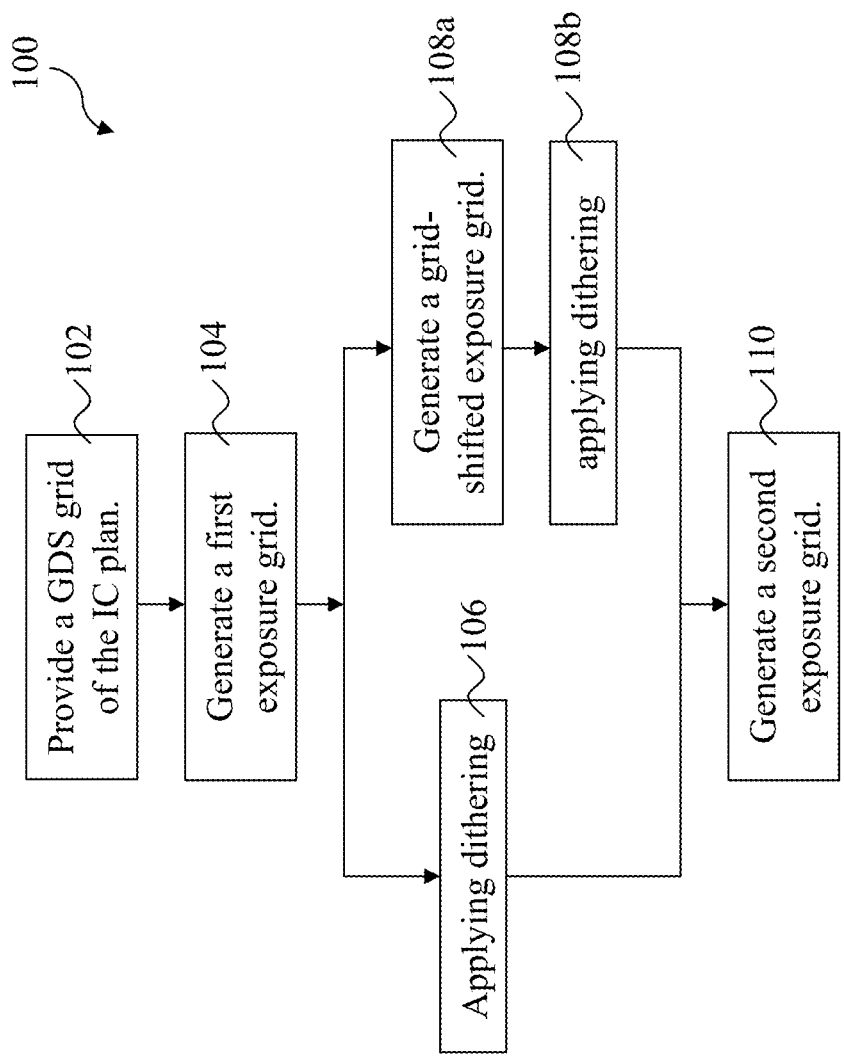
FIG. 1 is a flowchart of an example method of a data preparation in lithography processes at stages constructed according to various aspects of the present disclosure.

According to an embodiment of the present disclosure, a method 100 of data preparation in lithography process is illustrated as a flowchart in FIG. 1. The method 100 includes blocks 102-110, each of which is discussed below in more detail and with reference to an example in various additional figures of the disclosure.

Figure 2:
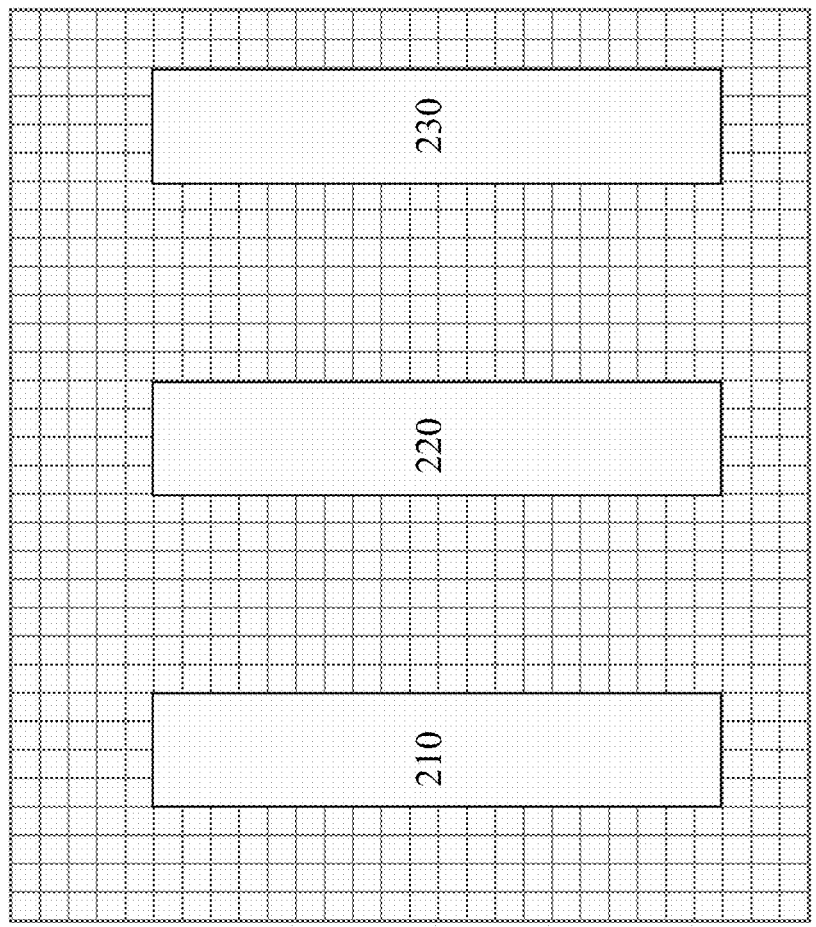
FIG. 2 is a simplified schematic diagram of an IC layout design GDS grip of an example embodiment of a method of data preparation in lithography processes at stages constructed according to various aspects of the present disclosure.

Referring to FIGS. 1 and 2, the method 100 begins at step 102 by providing an integrated circuit (IC) layout design in a graphic database system (GDS) grid 200. The IC layout design may contain a plurality of semiconductor features. The IC layout design may be generated as a computer file, for example as a GDS type file or as an open artwork system interchange standard (OASIS) type file. The GDS or OASIS files are database files used for data exchange of IC layout artwork. For example, these files may have binary file formats for representing planar geometric shapes, text labels, as well as other layout information of the IC layout. The GDS or OASIS files may each contain multiple layers. The GDS or OASIS files may be used to reconstruct the IC layout artwork, and as such can be transferred or shared between various fabrication tools.

A proximity correction process may also apply to the GDS grid 200. The proximity correction process is a lithography enhancement technique that can be used to compensate for image errors due to process defects. For example, electron scattering during the performance of a maskless lithography process may adversely impact regions of the substrate near the region that is being exposed by the electron beams. Consequently, these nearby regions may become inadvertently exposed, thereby causing variations of the desired exposure pattern. To compensate for these image errors, proximity correction techniques such as dose modification, shape modification, or background correction exposure may be employed in a maskless lithography process. The performance of the proximity correction process in the GDS grid 200 makes the fabricated semiconductor feature patterns resemble the desired patterns more accurately.

For the sake of providing an example, a simplified IC layout design GDS grid 200 is illustrated in FIG. 2. The IC layout design GDS grid 200 includes a plurality of circuit sections 210-230, represented by a plurality of polygons. In the illustrated embodiment, the circuit sections 210-230 may include different logic sections and varying sizes. The sizes may refer to physical dimensions of the circuit sections 210-230 or the amount of data that is contained within each section. The IC layout design GDS grid 200 includes a two-dimensional array of pixels. Pixels are often represented using dots or squares in a coordinate system. Each pixel has an exposure intensity value (represented by a digital number) and a location address (corresponding to its coordinates).

Continuing with FIG. 2, a pixel size of the GDS grid 200 is selected typically to make boundaries of a layout design pattern (such as polygons) fairly align with boundaries of pixels in the IC layout design GDS grid 200, as shown in FIG. 2. Pixels in the IC layout design GDS grid 200 are divided into two types: either interior or exterior of the polygon of the IC layout design. For an interior pixel (or an exterior pixel), a lithography exposure dose is set at maximum intensity (or at minimum intensity), which is referred to as a black color or a white color, respectively.

Figure 3:
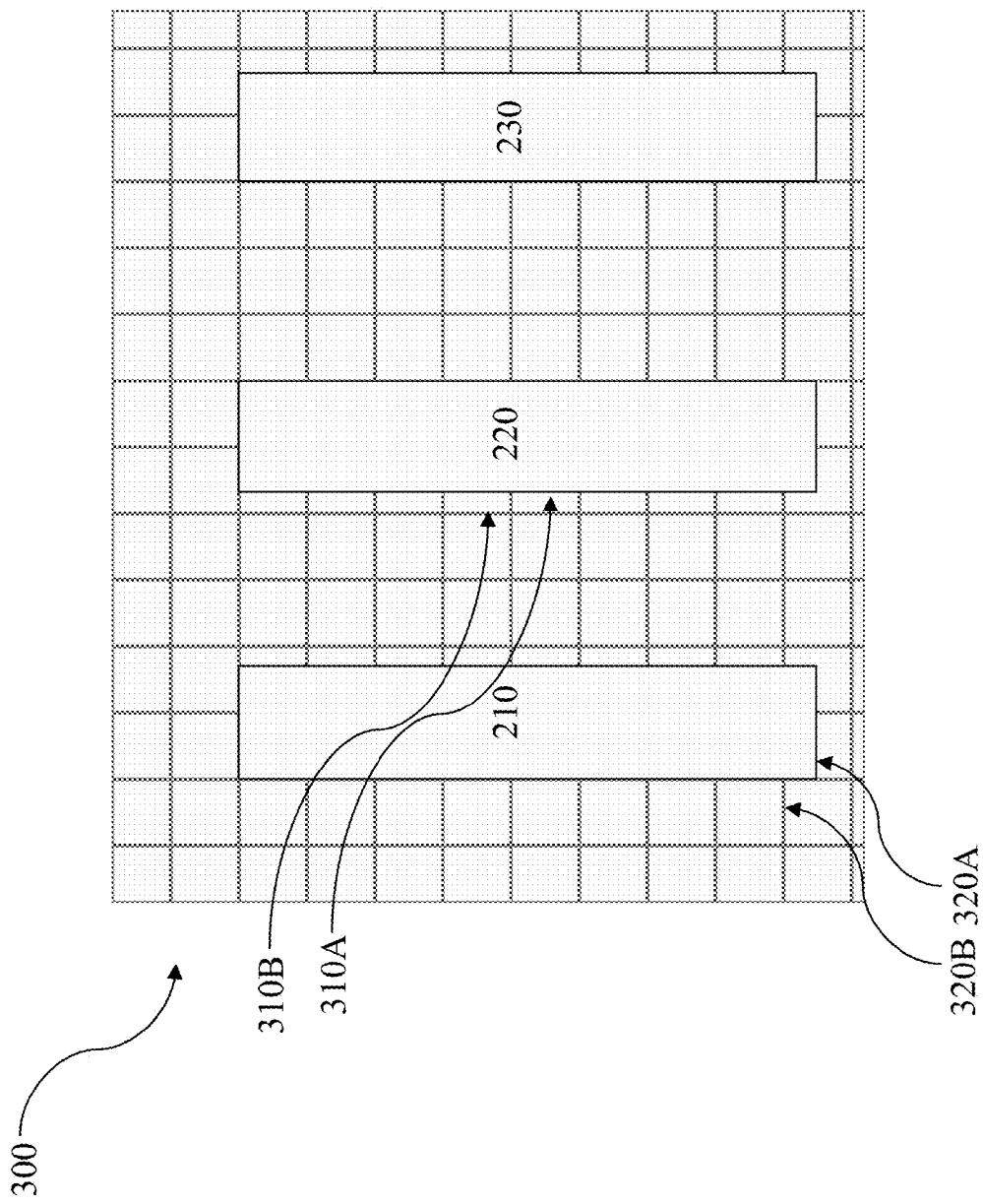
FIG. 3 is a simplified schematic diagram of a first exposure grid of an example embodiment of a method of data preparation in lithography processes at stages constructed according to various aspects of the present disclosure.

The method 100 proceeds to step 104 by converting the IC layout design GDS grid 200 to a first exposure grid 300, a machine-specific form, as shown in FIG. 3. In order to implement the IC layout design GDS 200 by a lithography machine, a data preparation process is carried out to form a machine-specific data format. The data preparation process starts with converting the IC layout design GDS grid 200 to a machine-specific exposure grid, referred to as a first exposure grid 300. The first exposure grid 300 may include a two-dimensional array of pixels in a coordinate system. A lithography exposure process sweeps across the entire surface of a substrate to be patterned, pixel by pixel (or pixels by pixels). The pixel size of the first exposure grid 300 impacts not only computing data volume in the data preparation process but also on the throughput in the downstream or later processing.

The pixel size of the first exposure grid 300 is selected to be typically larger than the pixel size of the IC layout design GDS 200 for gaining process throughput. For example, a pixel size in the IC layout design GDS 200 is 0.1 nm and a pixel size in the first exposure grid 300 is 3 nm, which is 30 times larger. When the pixel size of the first exposure grid 300 is larger than the IC layout design GDS grid 200, the boundaries of polygons (of the IC layout design) may not match with the boundaries of pixels in some locations in the first exposure grid 300, such as in 310A, 310B, 320A and 320B, as shown in FIG. 3. This mismatching generates partial filled pixels in the first exposure grid 300, referred to as pixel size truncations. The larger pixel size may result in less amount of computation required in the downstream or later processing, but induces more image errors.

Figure 4:
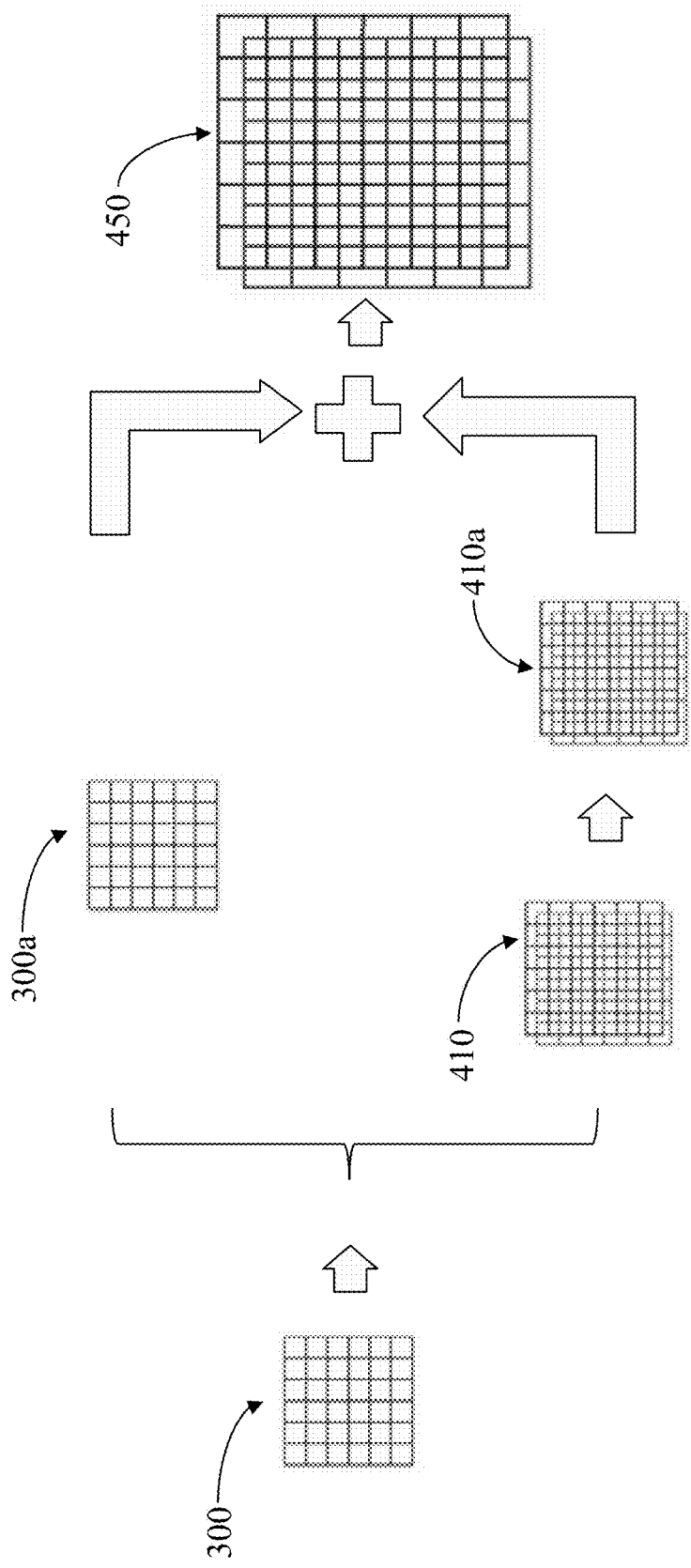
FIG. 4. is a simplified schematic diagram of generating a second exposure grid of an example embodiment of a method of data preparation in lithography processes at stages constructed according to various aspects of the present disclosure.

The method of 100 proceeds to step 106 and step 108a, in parallel. In the step 106, a non-directional dithering applies to the first exposure grid 300, as shown in FIG. 4. After receiving dithering, the first exposure grid 300 is referred to as the first exposure grid 300a. Dithering is a computer graphics technique. It can successfully make a digitization system more like an analog-like system. Dithering is able to increase the filling resolution without reducing the pixel size.

For example, a dithering algorithm scans a pixel grid from left to right, top to bottom, quantizing pixel values one by one. A data of an exposure intensity level (referred as to a grey level) is assigned to each pixel. In a dithering algorithm, the grey level of a pixel (referred to as a source pixel) is compared to a predetermined grey-level scale, such as the discrete grey-level scales. When the source pixel is completely inside (or outside) of a polygon (the IC layout design feature), the grey level of the source pixel is set to be the maximum (or minimum) of grey-level in the predetermined grey-level scale.

When a source pixel is on the polygon edge (hence not completely inside nor completely outside a polygon), the grey level of the source pixel is set to be the closest grey level in the predetermined grey-level scale, and now the pixel is referred to as an output pixel. After outputting the pixel, the dithering algorithm calculates the difference between the source pixel and the output pixel (a simple subtraction), and then it spreads this difference (referred to as an "error") over neighboring pixels. By dithering, each time the quantization error is transferred to the neighboring pixels, the pixels that have already been quantized are not affected. As an example, in the Floyd-Steinberg dithering, the pixel immediately to the right of the pixel being quantized gets 7/16 of the error (the divisor is 16 because the weights add to 16), the pixel directly below the pixel being quantized gets 5/16 of the error, and the diagonally adjacent pixels of the pixel being quantized get 3/16 and 1/16. Dithering results in more pixels being rounded downwards, and it is more likely that the next pixel will be rounded upwards. As an average, the quantization error is close to zero.

Another of the broader forms of the present disclosure involves applying multiple dithers to the first exposure grid 300. In furtherance of the embodiment, the dither is non-directional dithering, which can dither along the right direction of the first exposure grid 300 as well as dither along the left direction of the first exposure grid 300. In a multiple dither, the dither may start along either direction, the right direction or the left direction.

The method 100 proceeds to a parallel step 108a by converting the first exposure grid 300 to a grid-shifted exposure grid 410, as shown in FIG. 4. For a two-dimensional (such as X and Y) coordinate system of the first exposure grid 300, a grid shift may include shifting the coordinate system along a first direction, or along a second direction, or along both first and second directions. As an example, the coordinate system of the first exposure grid 300 shifts ½ pixel size in both of first and second direction, and it is referred to as a ½ grid shift. The grid-shifted exposure grid 410 has the same pixel size as the first exposure grid 300, which is p nm.

The algorithm 100 proceeds to step 108b by applying dither to the grid-shifted exposure grid 410, as shown in FIG. 4. After receiving differing, the grid-shifted exposure grid 410 is referred to as the grid-shifted exposure grid 410a. The dither algorithm may include multiple dithers and the direction of each dither (along the right direction or left direction) is independent of each other.

Figure 5:
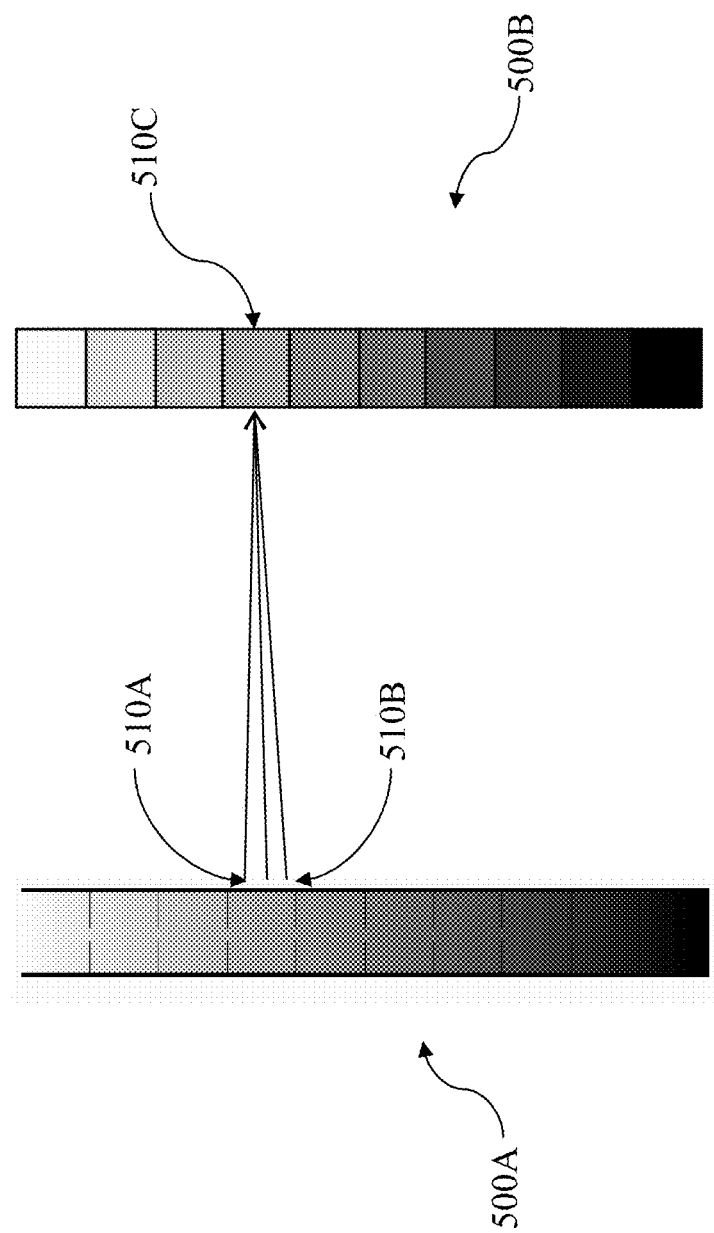
FIG. 5 is a simplified schematic diagram of grey level spectrums of an example embodiment of a method of data preparation in lithography processes at stages constructed according to various aspects of the present disclosure.

During the dithering process, the lithography exposure intensity is quantized, Referring to FIG. 5, from a continuous grey-level spectrum to a discrete grey-level scales 500B. A maximum exposure dose of the discrete grey-level scales 500B is usually set to be the same as the dose used for the black color pixel and the minimum exposure dose of the discrete grey-level scales 500B is usually set to be the same as the one used for the white color pixel, or vice versa. A grey level error is induced when converting from a grey-level spectrum to a discrete grey-level scale. For example, in the grey-level spectrum 500A, all different grey-levels between the level 510A and the level 510B are converted to one grey-level 510C in the discrete grey-level scales 500B. In another words, one grey-level 510C represents all different levels between the level 510A and 510B. An error induced by quantization of grey level is referred to as grey-level truncation.

The exposure dose intensity (grey level) delivered to each pixel is controlled by a quantization state of data bits stored in the first exposure grid 300a and the grid-shifted exposure grid 410a. For example, if 6 bits are used, a total of 64 grey levels are established in the discrete grey-level scales 500B, from a grey level zero (white color) to a grey level 63 (black color). The more divided the levels of discrete grey-level scales 500B, the closer to the spectrum 500A, the more accurate the grey-level, the more bits are used, and the larger the data volume to be stored and to be computed in data preparation, in the downstream or later processing.

The pixel size truncation and grey-level truncation may induce errors in critical dimension (CD) control and CD uniformity (CDU). The conventional methods to solve pixel size truncation and grey-level truncation are reducing pixel size and using more data bit for grey-level scales with a cost of a larger data volume and a longer cycle time in data preparation.

A normalized data volume (NDV) is introduced here to evaluate and compare data volume among different data preparation algorithms. The NDV is defined as data volume per unit area of pixel. The NDV can be calculated from:

$$NDV = GreyLevel(bit)/(Pixel\ Size)^2(nm^2)$$

For example, if the amount of bit used for grey level is k, the GreyLevel (bit) is GreyLevel (k). Under this condition, each pixel's exposure intensity (referred to as grey level) is coded by using a k-bit-digital number. The NDV represents a normalized data volume by a density of allowed grey levels per unit area. As an example, when pixel size of the first exposure grid 300 is p nm and the grey level uses k bit (which allows grey levels of 2 to (bit)$^{th}$ power), the NDV equals to GreyLevel (k)/p$^2$.

In the depicted embodiment, The grey level of the first exposure grid 300a may be selected to be less than the first exposure grid 300. For example, if the grey level of the first exposure grid 300 uses k bit (which allows grey levels of 2 to (bit)$^{th}$ power), the grey level of the first exposure grid 300a uses (k−1) [which allows half of grey levels of 2 to (bit)$^{th}$ power]. The NDV of the first exposure grid 300a equals to half of the NDV of the first exposure grid 300, which is GreyLevel (k)/p$^2$ in the example. Meanwhile the grid-shifted exposure grid 410a has a pixel size of p nm and it uses (k−1) bits for the grey level, the NDV of the grid-shifted exposure grid 410a is also equal to half of the NDV of the first exposure grid 300.

The method 100 proceeds to step 110 by adding the first exposure grid 300a to the grid-shifted exposure grid 410a to form a second exposure grid 450, as shown in FIG. 4. The pixel size of the second exposure grid 450 remains the same as the exposure grid 300, which is p nm. When the grey level of the second exposure grid 450 uses (k−1) bits, which is the same as the first exposure grid 300a and the grid-shifted exposure grid 410a, the NDV of the second exposure grid 450 is the sum of the NDV of the first exposure grid 300a and the NDV of the grid-shifted exposure grid 410a, as shown below:

$$NDV_{450}=\tfrac{1}{2}[GreyLevel(k)/p^2]+\tfrac{1}{2}[GreyLevel(k)/p^2]=NDV_{300}$$

Where $NDV_{450}$ is the NDV of the second exposure grid 450 and k is the amount of bit being used for a grey level, $NDV_{300}$ is the NDV of the first exposure grid 300.

It is shown that the data volume (represent by NDV) of the second exposure grid 450 is the same as the first exposure grid 300. It has been demonstrated that, with fairly the same data volume, the second exposure grid 450 achieves a lower CD error, a better CD uniformity and a lower center mass error than the first exposure grid 300.

Based on the discussions above, it can be seen that the present disclosure offers a new data preparation algorithm to improve CD control, CD uniformity and center mass error reduction without increasing pixel size and grey level bit amount. The new data preparation algorithm combines multiple-grid (MG) and multiple-dithering (MD) techniques to achieve smaller pixel truncation error and grey level truncation error without increasing data volume.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for use in a lithography process, comprising:
   providing an integrated circuit (IC) layout design in a graphic database system (GDS) grid;
   converting the IC layout design GDS grid to a first exposure grid;
   applying a non-directional dither technique to the first exposure grid;
   applying a grid shift to the first exposure grid to generate a grid-shifted exposure grid;
   applying non-directional dithers to the grid-shifted exposure grid; and
   after applying the non-directional dither technique to the first exposure grid and after applying non-directional dithers to the grid-shifted exposure grid, adding, by a computer, the first exposure grid to the grid-shifted exposure grid to generate a second exposure grid.

2. The method of claim 1, wherein the first exposure grid is formed by a two-dimensional array of pixels, and wherein the pixel size is selected to be larger than the pixel size of the IC layout design grid.

3. The method of claim 1, wherein the non-directional dithers include dithering along a first direction.

4. The method of claim 1, wherein the non-directional dithers include dithering along a second direction.

5. The method of claim 1, wherein multiple non-directional dithers are applied to the first exposure grid.

6. The method of claim 1, wherein Floyd-Steinberg dithering is applied to the first exposure grid.

7. The method of claim 1, wherein multiple grid shifts are applied to the first exposure grid.

8. The method of claim 1, wherein the grid shift comprises shifting along a first direction.

9. The method of claim 1, wherein the grid shift comprises shifting along a second direction.

10. The method of claim 1, wherein the grid shift comprises shifting along two directions.

11. The method of claim 1, wherein a direction of the grid shift is independent of a direction of dithering.

12. A method for providing a modified exposure grid, comprising:
   providing an integrated circuit (IC) layout design in a graphic database system (GDS) grid;
   converting the IC design layout GDS grid to a first exposure grid and using k bits for a grey level;
   dithering the first exposure grid and using less than k bits for grey level;
   applying a grid shift to the first exposure grid to generate a grid-shifted exposure grid and using less than k bits for grey level and applying a dither to the grid-shifted exposure grid; and
   after dithering the first exposure grid and after applying the dither to the grid-shifted exposure grid, adding, by a computer, the first exposure grid to the grid-shifted exposure grid to generate a modified exposure grid.

13. The method of claim 12, wherein after dithering the first exposure grid the first exposure grid uses k−1 bits for a grey level.

14. The method of claim 12, wherein after dithering the first exposure grid the pixel size of the first exposure grid is not larger than the first exposure grid.

15. The method of claim 12, wherein after applying the dither to the grid-shifted exposure grid the grid-shifted exposure grid uses k−1 bits for a grey level.

16. The method of claim 12, wherein after applying the dither to the grid-shifted exposure grid the pixel size of the grid-shifted exposure grid is less than the first exposure grid.

17. The method of claim 12, wherein the pixel size of the modified exposure grid is less than the first exposure grid.

18. The method of claim 12, further comprising performing multiple non-directional dithers to the first exposure grid.

19. The method of claim 12, further comprising performing multiple grid shifts to the first exposure grid.

20. A method of providing a grid for use in a lithography process, comprising:

provided an integrated circuit (IC) layout design in a graphic database system (GDS) grid with a plurality of polygons in a two-dimensional array of pixels coordinate system;

applying a proximity correction process to the IC layout design GDS grid;

converting the IC layout design GDS grid to a first exposure grid with a plurality of polygons in a two-dimensional array of pixels coordinate system, using a pixel size larger than the IC layout design GDS grid, and using k bits for a grey level;

applying dithering to the first exposure grid, wherein after applying dithering to the first exposure grid the first exposure grid uses less than k bits for a grey level;

applying a grid shift to the first exposure grid, wherein the grid-shifted exposure grid uses less than k bits for a grey level and applying dither to the grid-shifted exposure grid; and after applying the dithering to the first exposure grid and after applying the dither to the grid-shifted exposure grid, adding, by a computer, the first exposure grid to the grid-shifted exposure grid to generate a second exposure grid, wherein the second exposure grid contains a same or less data volume than the first exposure grid.

* * * * *